US008242937B2

(12) United States Patent
Wang

(10) Patent No.: US 8,242,937 B2
(45) Date of Patent: Aug. 14, 2012

(54) CONNECTING STRUCTURE OF KEYBOARD APPURTENACE AND KEYBOARD

(75) Inventor: Yi-Chen Wang, Taoyuan (TW)

(73) Assignee: Darfon Electronics Corp., Gueishan, Taoyuan (TW)

( * ) Notice: Subject to any disclaimer, the term of this patent is extended or adjusted under 35 U.S.C. 154(b) by 340 days.

(21) Appl. No.: 12/790,869

(22) Filed: May 31, 2010

(65) Prior Publication Data

US 2010/0309027 A1 Dec. 9, 2010

(30) Foreign Application Priority Data

Jun. 6, 2009 (TW) ............................... 98210056 U

(51) Int. Cl.
*H03K 17/94* (2006.01)

(52) U.S. Cl. .......................................... 341/22; 400/489

(58) Field of Classification Search .................... 341/22, 341/23; 400/489, 484, 485, 486, 472; 361/679
See application file for complete search history.

(56) References Cited

U.S. PATENT DOCUMENTS 7,828,489 B1 * 11/2010 Hargreaves et al. .......... 400/489

* cited by examiner

*Primary Examiner* — Joseph Lauture
(74) *Attorney, Agent, or Firm* — Winston Hsu; Scott Margo

(57) ABSTRACT

A connecting structure of keyboard appurtenance of the invention includes a base, an appurtenance, a first holding portion and a second holding portion. The first holding portion includes a platform, a first breaking hole that is formed in the platform and includes a first opening, and a passage extending from the first opening to a side of the platform. The second holding portion includes a pillar and a cover connected to an end of the pillar. The base and the appurtenance are equipped with the first holding portion and the second holding portion correspondingly and thus the appurtenance can be connected to the base through disposing the pillar of the second holding portion in the first breaking hole.

32 Claims, 7 Drawing Sheets

CONNECTING STRUCTURE OF KEYBOARD APPURTENACE AND KEYBOARD

BACKGROUND OF THE INVENTION

1. Field of the Invention

The invention relates to a connecting structure for connecting a base and an appurtenance and, more particularly, to a connecting structure of a keyboard appurtenance. Furthermore, the connecting structure can be applied in a keyboard to connect a keyboard appurtenance and a keyboard base.

2. Description of the Prior Art

A dummy key or a decorating strip (referring to an appurtenance hereinafter) is usually fixed on a base of a keyboard by hot melt adhesive or by hook. Referring to FIG. 1A, FIG. 1A is a section view illustrating an appurtenance 13 assembled on a base 11 by hot melt adhesive according to the prior art. FIG. 1B is an exploded diagram illustrating the base 11 and the appurtenance 13 in FIG. 1A. As shown in FIG. 1A and FIG. 1B, the base 11 comprises a hollow portion 111, and the appurtenance 13 comprises an inner surface 131 and a pillar 133. The pillar 133 extends from the inner surface 131. When assembling the appurtenance 13 by hot melt adhesive, first of all, pass the pillar 133 through the hollow portion 111 of the base 11, and then melt an end of the pillar 133 far away from the inner surface 133 with the base 11.

Referring to FIG. 2A, FIG. 2A is a section view illustrating an appurtenance 23 assembled on a base 21 by hook according to the prior art. FIG. 2B is an exploded diagram illustrating the base 21 and the appurtenance 23 in FIG. 2A. As shown in FIG. 2A and FIG. 2B, the base 21 has a groove 211, and the appurtenance 23 comprises an inner surface 231 and a pillar 233. The pillar 233 extends from the inner surface 231, and a hook-shaped structure 2331 is formed at an end of the pillar 233 far away from the inner surface 231. When assembling the appurtenance 23 by hook, put the hook-shaped structure 2331 of the pillar 233 into the engaging 211 so as to fix the appurtenance 23 on the base 21.

When fixing the appurtenance 13 on the base 11 by hot melt adhesive, there must be an additional manufacturing process due to heat treatment operation. When fixing the appurtenance 23 on the base 21 by hook, an appropriate width of the groove 211 is required. The larger the width of the groove 211 is, the easier the appurtenance 23 can be assembled on the base 21. However, the hook-shaped structure 2331 of the appurtenance 23 will drop out of the groove 211 easily as well. On the other hand, the smaller the width of the groove 211 is, the harder the hook-shaped structure 2331 can be inserted into the groove 211 so as to increase difficulty for assembly.

SUMMARY OF THE INVENTION

An objective of the invention is to provide a connecting structure of keyboard appurtenance such that the aforesaid problems can be solved.

According to an embodiment, the connecting structure of keyboard appurtenance of the invention comprises a base, an appurtenance, a first holding portion and a second holding portion. The first holding portion comprises a platform, a first breaking hole formed in the platform and a passage. The first breaking hole has a first opening, and the passage extends from the first opening to a first side of the platform. The second holding portion comprises a pillar and a cover. A first end of the pillar is connected to the cover, and an outer diameter of the cover is greater than a bore diameter of the first breaking hole and an outer diameter of the pillar. The second holding portion is disposed on one of the base and the appurtenance, the first holding portion is disposed on the other one of the base and the appurtenance correspondingly, and the pillar of the second holding portion is contained in the first breaking hole by the passage, such that the appurtenance is connected to the base.

Another objective of the invention is to provide a keyboard equipped with the aforesaid connecting structure of keyboard appurtenance. According to another embodiment, the keyboard of the invention comprises a base, a plurality of keyswitches, an appurtenance, a first holding portion and a second holding portion. The plurality of keyswitches is disposed on the base. The first holding portion comprises a platform, a first breaking hole and a passage. The first breaking hole has a first opening, and the passage extends from the first opening to a first side of the platform. The second holding portion comprises a pillar and a cover. A first end of the pillar is connected to the cover, and an outer diameter of the cover is greater than a bore diameter of the first breaking hole and an outer diameter of the pillar. The second holding portion is disposed on one of the base and the appurtenance, the first holding portion is disposed on the other one of the base and the appurtenance correspondingly, and the pillar of the second holding portion is contained in the first breaking hole by the passage, such that the appurtenance is connected to the base.

In summary, the first holding portion and the second holding portion of the connecting structure of keyboard appurtenance and keyboard of the invention can be disposed on the appurtenance or the base correspondingly. When the appurtenance is going to be connected to the base, the pillar of the second holding portion passes through the passage of the first holding portion so as to be contained in the first breaking hole. Compared to the appurtenance and the base being connected by hot melt adhesive, the connecting structure of the invention can avoid redundant manufacturing processes. Compared to the appurtenance and the base being connected by hook, the connecting structure of the invention can fix the appurtenance and the base more stably and tightly.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
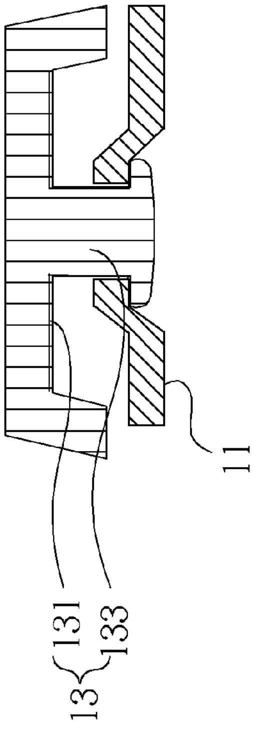
FIG. 1A PRIOR ART
FIG. 1A is a section view illustrating an appurtenance assembled on a base by hot melt adhesive according to the prior art.
Figure 1B:
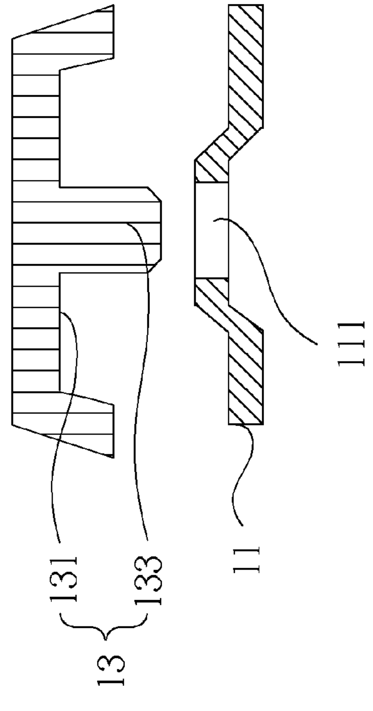
FIG. 1B PRIOR ART
FIG. 1B is a schematic exploded diagram illustrating the base and the appurtenance in FIG. 1A.
Figure 2A:
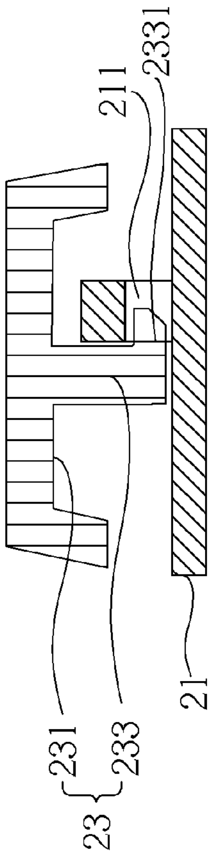
FIG. 2A PRIOR ART
FIG. 2A is a section view illustrating an appurtenance assembled on a base by hook according to the prior art.
Figure 2B:
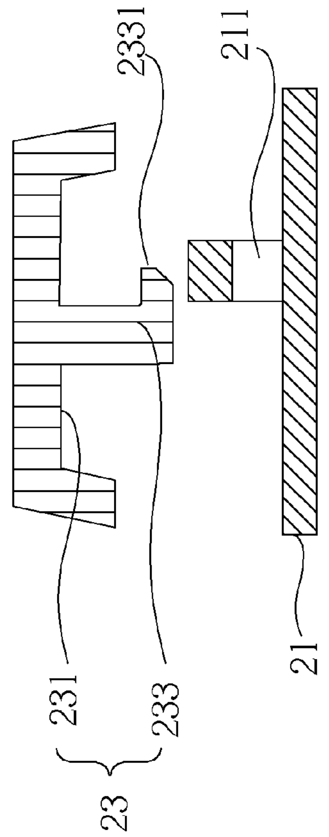
FIG. 2B PRIOR ART
FIG. 2B is a schematic exploded diagram illustrating the base and the appurtenance in FIG. 2A.
Figure 3A:
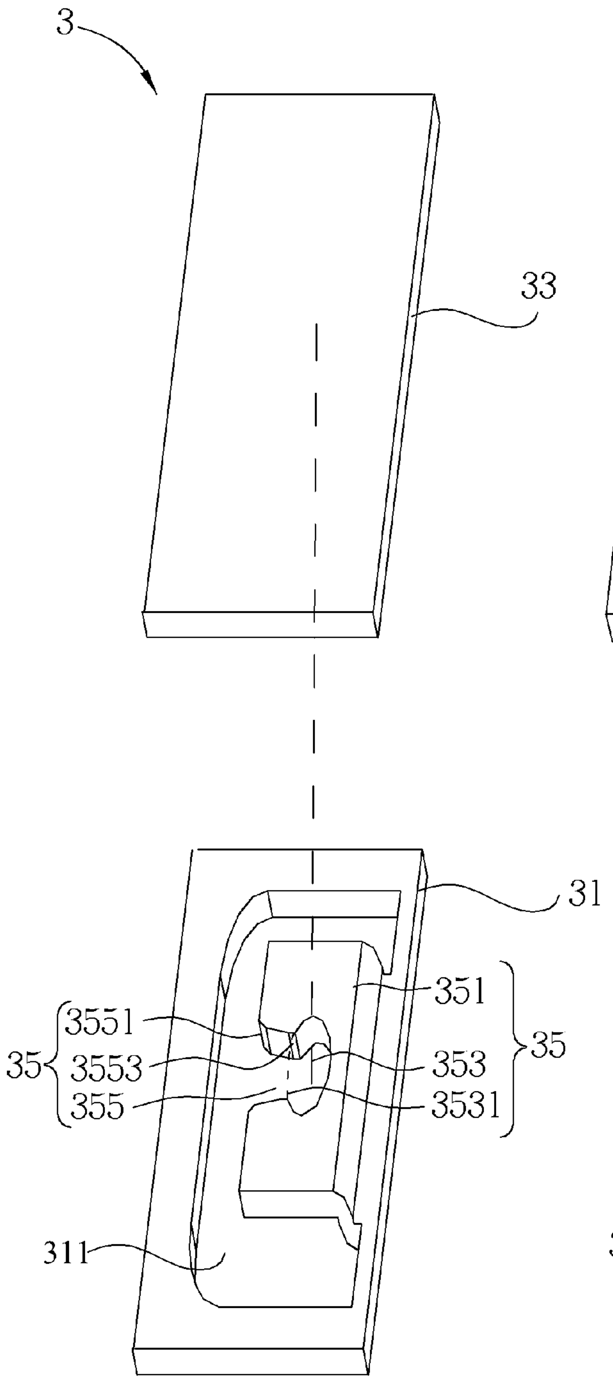
FIG. 3A is an exploded diagram illustrating a connecting structure of keyboard appurtenance according to an embodiment of the invention.
Figure 3B:
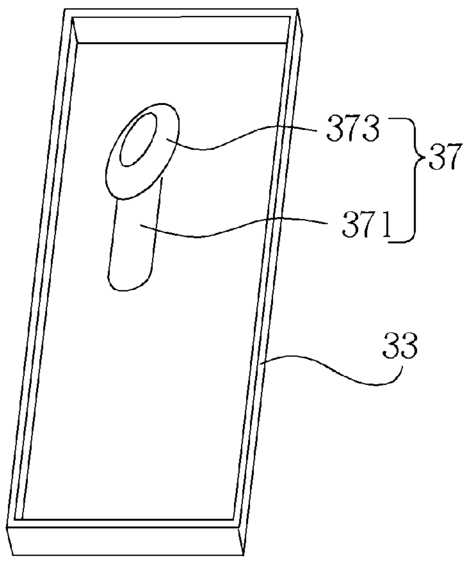
FIG. 3B is another view illustrating an appurtenance in FIG. 3A.
Figure 3C:
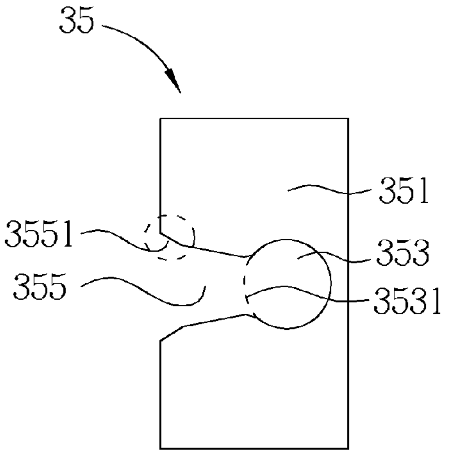
FIG. 3C is a top view illustrating a first holding portion in FIG. 3A.

Referring to FIG. 3A, FIG. 3B and FIG. 3C, FIG. 3A is an exploded diagram illustrating a connecting structure 3 of keyboard appurtenance according to an embodiment of the invention. FIG. 3B is another view illustrating an appurtenance 33 in FIG. 3A. FIG. 3C is a top view illustrating a first holding portion 35 in FIG. 3A. As shown in FIG. 3A, FIG. 3B and FIG. 3C, the connecting structure 3 of keyboard appurtenance comprises a base 31, an appurtenance 33, a first holding portion 35 and a second holding portion 37.

The base 31 has a hollow portion 311. The hollow portion 311 is usually formed by cutting out through the base 31 according to a predetermined shape. The first holding portion 35 comprises a platform 351 and a passage 355. A first breaking hole 353 is formed in the platform 351. The first breaking hole 353 has a first opening 3531 (represented by dotted line), and the passage 355 extends from the first opening 3531 to a first side of the platform 351. Furthermore, the passage 355 comprises a first guiding structure 3551 and a second guiding structure 3553 for guiding an object into the passage 355 and the first breaking hole 353. The first guiding structure 3551 is close to the first side of the platform 351 and is located on each of both sides of the passage 355. The second guiding structure 3553 is close to the first opening 3531 and is located on each of both sides of the passage 355 as well. A second side of the platform 355, which is not connected to the passage 355, is bent from the base 31. The second side of the platform 351 is connected to an edge of the hollow portion 311, and the platform 351 is located above the hollow portion 311. Since the platform 351 is connected to the edge of the hollow portion 311, the first holding portion 35 can be connected to the base 31.

The second holding portion 37 comprises a pillar 371 and a cover 373. A first end of the pillar 371 is connected to the cover 373. An outer diameter of the cover 373 is greater than a bore diameter of the first breaking hole 353 and greater than an outer diameter of the pillar 371. A second end of the pillar 371 is connected to the appurtenance 33, such that the second holding portion 37 is connected to the appurtenance 33. In general, a position of the pillar 371 corresponds to a position of the first breaking hole 353.

When assembling the base 31 and the appurtenance 33, first of all, the pillar 371 of the second holding portion 37 is inserted into the passage 355 from a gap between the platform 351 and the hollow portion 311 through the first guiding structure 3551. For the sake of getting the pillar 371 passed easily, a maximum width between opposite guiding structures 3551 is greater than the outer diameter of the pillar 371. After being inserted into the passage 355, the pillar 371 proceeds along the passage 355 toward the first opening 3531, and passes through the first opening 3531 so as to be inserted into the first breaking hole 353. In this embodiment, a width of the passage 355 is getting narrower and narrower along the passage 355 from the first side of the platform 351 to the first opening 5531, as shown in FIG. 3A. A minimum width of the passage 355 is smaller than the outer diameter of the pillar 371, so as to avoid the pillar 371 to return the passage 355 again through the first opening 3531 after being inserted into the first breaking hole 353.

Figure 4A:
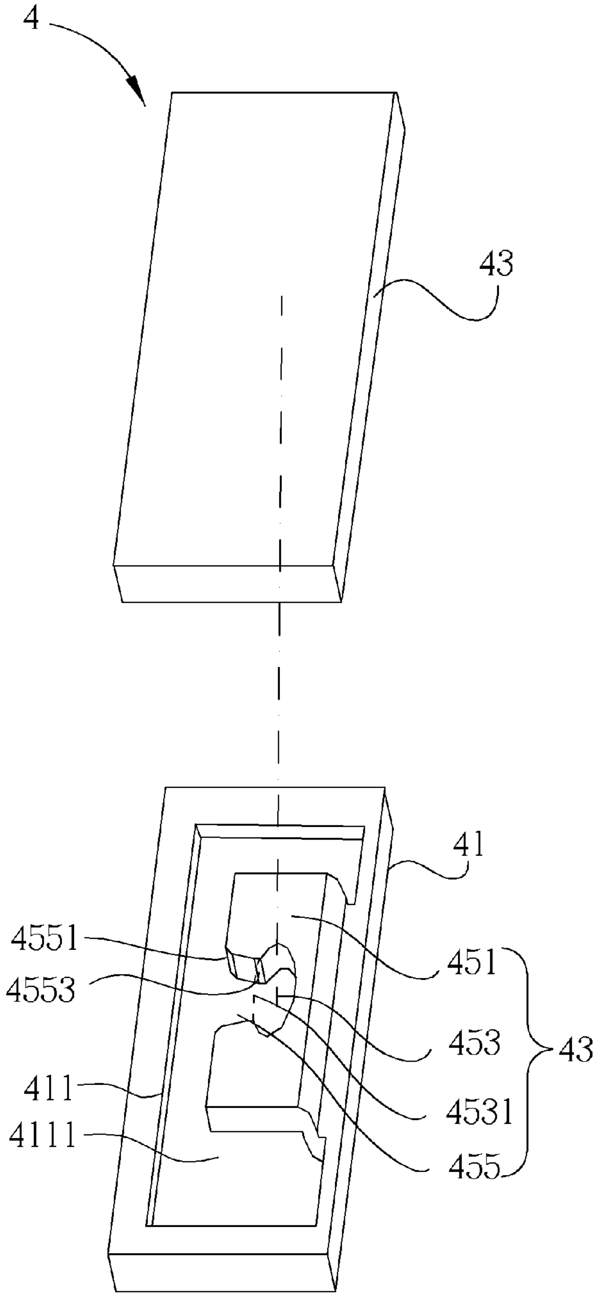
FIG. 4A is an exploded diagram illustrating a connecting structure of keyboard appurtenance according to another embodiment of the invention.
Figure 4B:
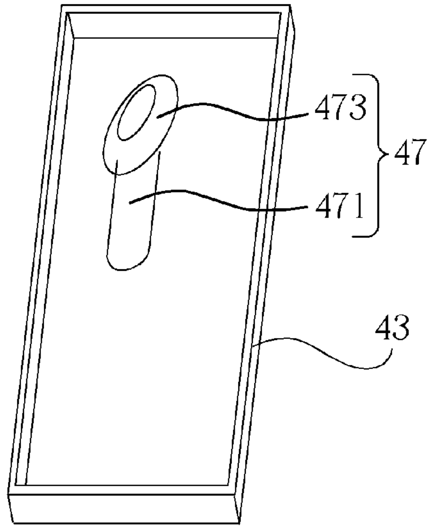
FIG. 4B is another view illustrating an appurtenance in FIG. 4A.

It should be noticed that the hollow portion 311 can be replaced by a recess in practical application. Furthermore, as long as there is enough space between the base 31 and the platform 351 for containing parts of the pillar 371 and the cover 373, the invention can be implemented without the hollow portion or the recess. Referring to FIG. 4A, FIG. 4A is an exploded diagram illustrating a connecting structure 4 of keyboard appurtenance according to another embodiment of the invention. FIG. 4B is another view illustrating an appurtenance 43 in FIG. 4A. As shown in FIG. 4A and FIG. 4B, the connecting structure 4 of keyboard appurtenance comprises a base 41, an appurtenance 43, a first holding portion 45 and a second holding portion 47. The first holding portion 45 comprises a platform 451, a first breaking hole 453, a passage 455, a first opening 4531 (represented by dotted line), a first guiding structure 4551 and a second guiding structure 4553. The second holding portion 47 comprises a pillar 471 and a cover 473. In this embodiment, structures and functions of the appurtenance 43, the first holding portion 45 and the second holding portion 47 are identical to the appurtenance 33, the first holding portion 35 and the second holding portion 37 in FIG. 3A respectively.

The difference between the connecting structure 4 in FIG. 4A and connecting structure 3 in FIG. 3A is that the base 41 in FIG. 4A comprises a recess 411 for replacing the hollow portion 311. The hollow portion 311 is formed by piercing a hole in the platform 351, while the recess 411 has a bottom surface 4111 instead of cutting out through the platform 451. There is a distance between the bottom surface 4111 and the platform 451. The cover 473 of the second holding portion 47 and a part of the pillar 471 can be contained in a gap between the bottom surface 4111 and the platform 451, such that the pillar 471 is inserted into the passage 455 so as to be engaged with the first holding portion 45. In this embodiment, the relationship among an outer diameter of the cover 473, an outer diameter of the pillar 471, a minimum width of the passage 455, a maximum width between opposite first guiding structures 4551 and a bore diameter of the first breaking hole 453 is identical to that in FIG. 3A, so it will not be depicted herein.

Figure 5B:
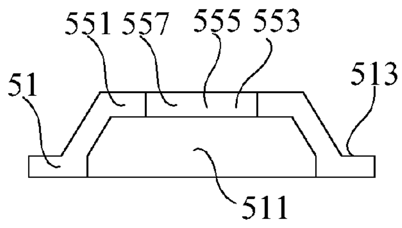
FIG. 5B is a section view along a line X-X in FIG. 5A.
Figure 5A:
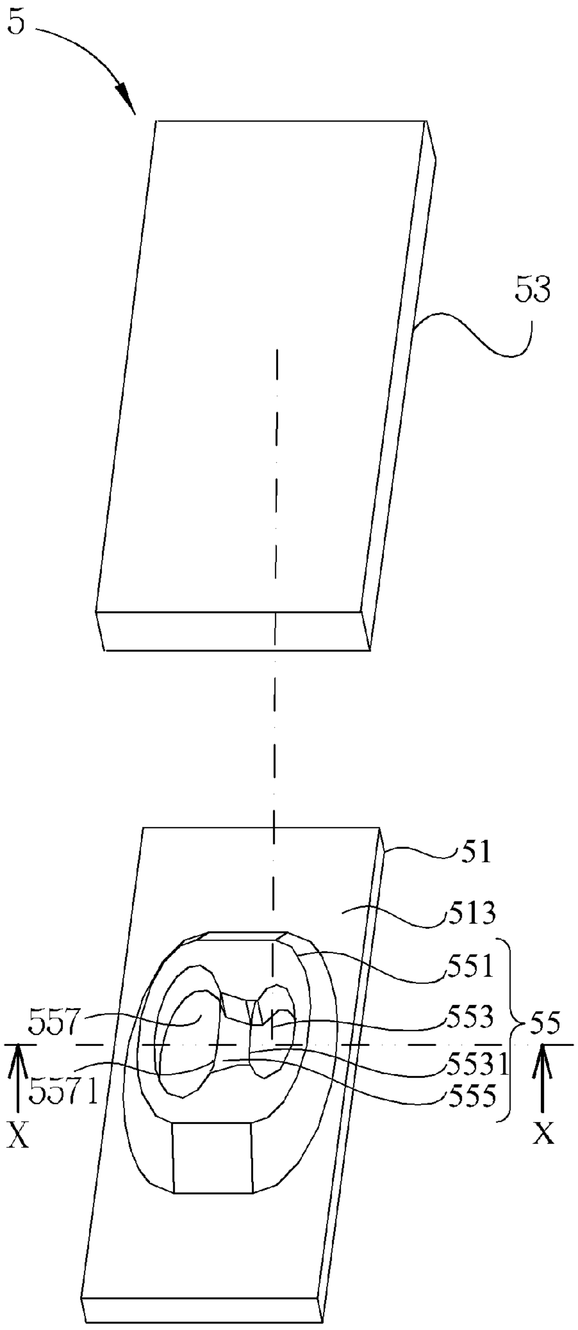
FIG. 5A is an exploded diagram illustrating a connecting structure of keyboard appurtenance according to another embodiment of the invention.
Figure 5C:
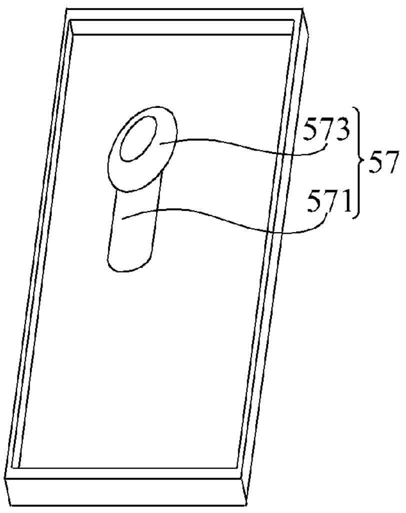
FIG. 5C is another view illustrating an appurtenance in FIG. 5A.

As mentioned above, the second side of the first holding portion 35, 45 of the connecting structure 3, 4 of keyboard appurtenance is connected to an edge of the hollow portion 311 and the recess 5411. In practical application, the structure of the platform 351, 451 is not limited to the structure shown in FIG. 3A and FIG. 4A. Referring to FIG. 5A and FIG. 5B, FIG. 5A is an exploded diagram illustrating a connecting structure 5 of keyboard appurtenance according to another embodiment of the invention. FIG. 5B is a section view along a line X-X in FIG. 5A. FIG. 5C is another view illustrating an appurtenance 53 in FIG. 5A. As shown in FIG. 5A, FIG. 5B and FIG. 5C, the connecting structure 5 of keyboard appurtenance comprises a base 51, an appurtenance 53, a first holding portion 55 and a second holding portion 57.

The base 51 has a hollow portion 511 and a surface 513. The first holding portion 55 comprises a platform 551, a first breaking hole 553, a passage 555 and a second breaking hole 557. The first breaking hole 553 is formed in the platform 551. The first breaking hole 553 has a first opening 5531 (represented by dotted line), the second breaking hole 557 has a second opening 5571 (represented by dotted line), and the passage 555 extends from the first opening 5531 to the second opening 5571. The platform 551 is connected to an edge of the hollow portion 511, and the platform 551 is located above the hollow portion 511. The second holding portion 57 comprises a pillar 571 and a cover 573. A first end of the pillar 571 is connected to the cover 573 for covering the pillar 571, and a second end of the pillar 571 is connected to the appurtenance 53. Accordingly, the second holding portion 57 can be connected to the appurtenance 53. In general, a position of the pillar 571 corresponds to a position of the first breaking hole 553.

When assembling the base 51 and the appurtenance 53, first of all, the cover 573 of the second holding portion 57 and a part of the pillar 571 pass through the second breaking hole 557. For the sake of getting the pillar 571 passed easily, a bore diameter of the second breaking hole 557 is greater than an outer diameter of the cover 573. After being inserted into the second breaking hole 557, the pillar 571 proceeds along the passage 555 toward the first opening 5531, and passes through the first opening 5531 so as to be inserted into the first breaking hole 553. Similar to those mentioned above, a width of the passage 555 is getting narrower and narrower along the passage 555 from the second opening 5571 to the first opening 5531, as shown in FIG. 5A. A minimum width of the passage 555 is smaller than the outer diameter of the pillar 571, so as to avoid the pillar 571 to return the passage 555 again through the first opening 5531 after being inserted into the first breaking hole 553, such that the first holding portion 535 will not depart from the second holding portion 57 easily.

It should be noticed that the base 51 can be achieved without the hollow portion 511, and a periphery of the platform 551 can be connected to the surface 513 as long as there is enough space between the platform 551 and the surface 513 for containing the cover 573 of the second holding portion 57. Furthermore, a guiding structure can be formed at a position close to the first opening 5531 and the second opening 5571.

Figure 6A:
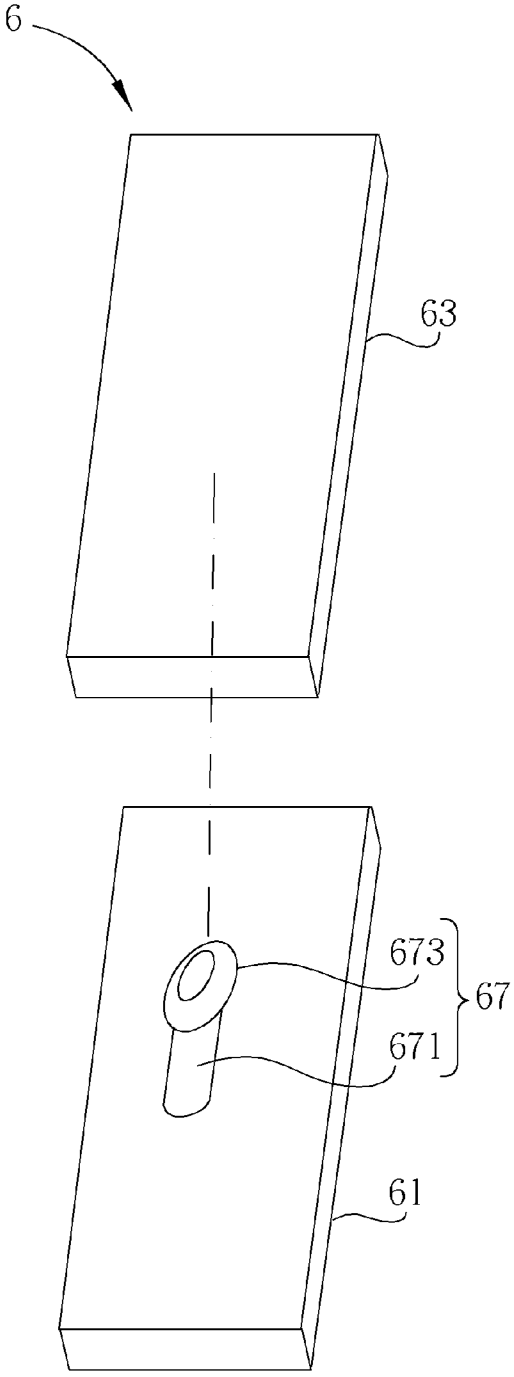
FIG. 6A is an exploded diagram illustrating a connecting structure of keyboard appurtenance according to another embodiment of the invention.
Figure 6B:
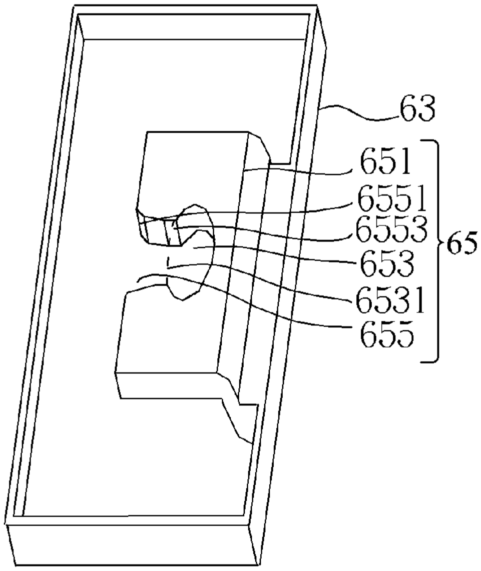
FIG. 6B is another view illustrating an appurtenance in FIG. 6A.

In practical application, the first holding portions 35, 45, 55 are not limited to be connected to the bases 31, 41, 51. The first holding portions 35, 45, 55 can be connected to the appurtenances 33, 43, 53, and the second holding portions 37, 45, 55 can be connected to the bases 31, 41, 51. Referring to FIG. 6A and FIG. 6B, FIG. 6A is an exploded diagram illustrating a connecting structure 6 of keyboard appurtenance according to another embodiment of the invention. FIG. 6B is another view illustrating an appurtenance 63 in FIG. 6A. As shown in FIG. 6A and FIG. 6B, the connecting structure 6 of keyboard appurtenance comprises a base 61, an appurtenance 63, a first holding portion 65 and a second holding portion 67. The first holding portion 65 comprises a platform 651, a first breaking hole 653, a passage 655, a first opening 6531, a first guiding structure 6551 and a second guiding structure 6553. The second holding portion 67 comprises a pillar 671 and a cover 673. The first breaking hole 653 is formed in the platform 651. Furthermore, since structures, functions and relative designs (such as an outer diameter of the cover 673, an outer diameter of the pillar 671, a distance between opposite first guiding structures 6551 and a relationship between a width of the passage 655 and a bore diameter of the first breaking hole 653) of the appurtenance 63, the first holding portion 65 and the second holding portion 67 are identical to those in FIG. 3A, it will not be depicted herein.

A side of the platform 651 of the first holding portion 65 is connected to a side of the appurtenance 63, such that the first holding portion 65 is connected to the appurtenance 63. Another end of the pillar 671 of the second holding portion 67 is connected to the base 61. The appurtenance 63 can be fixed on the base 61 by the first holding portion 65 and the second holding portion 67. When assembling the appurtenance 63 and the base 61, the pillar 671 of the second holding portion 67 is located in the passage 655 and proceeds along the passage 655 to be inserted into the first breaking hole 653. As mentioned above, the outer diameter of the pillar 671 is smaller than a minimum width of the passage 655. Accordingly, the pillar 671 inserted into the first breaking hole 653 will not drop out easily.

Figure 7A:
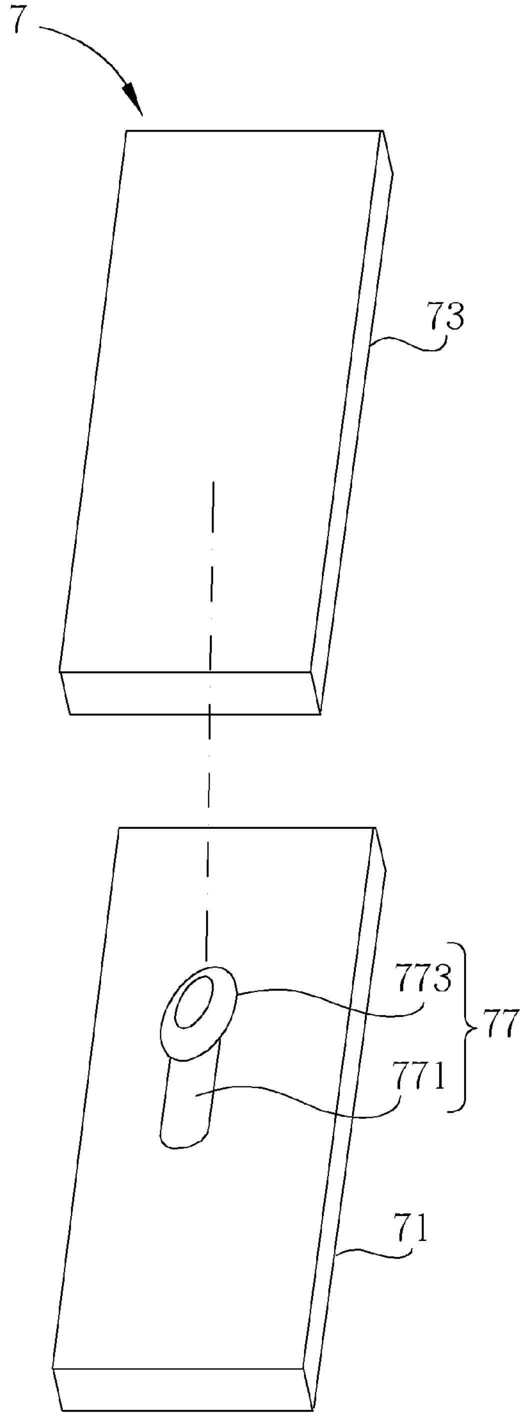
FIG. 7A is an exploded diagram illustrating a connecting structure of keyboard appurtenance according to another embodiment of the invention.
Figure 7B:
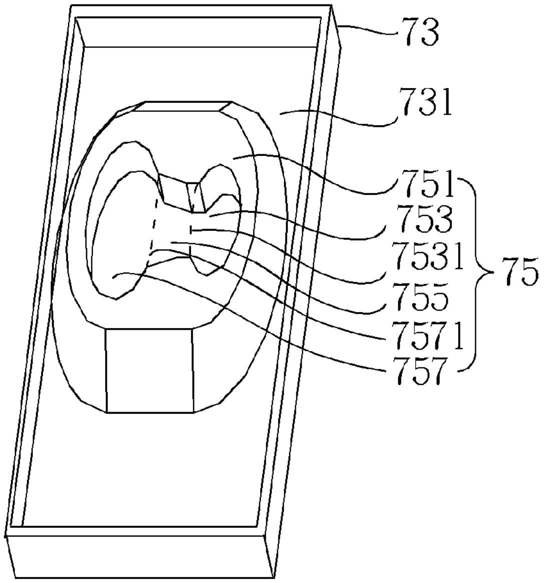
FIG. 7B is another view illustrating an appurtenance in FIG. 7A.

Certainly, the platform 651 of the connecting structure 6 of keyboard appurtenance in FIG. 6A can be replaced by the platform 551 in FIG. 5A. Referring to FIG. 7A and FIG. 7B, FIG. 7A is an exploded diagram illustrating a connecting structure 7 of keyboard appurtenance according to another embodiment of the invention. FIG. 7B is another view illustrating an appurtenance 73 in FIG. 7A. As shown in FIG. 7A and FIG. 7B, the connecting structure 7 of keyboard appurtenance comprises a base 71, an appurtenance 73, a first holding portion 75 and a second holding portion 77. The first holding portion 75 comprises a platform 751, a first breaking hole 753, a passage 755 and a second breaking hole 757. The first breaking hole 753 is formed in the platform 751. The first breaking hole 753 has a first opening 7531 (represented by dotted line), and the second breaking hole 757 has a second opening 7571 (represented by dotted line). The passage 755 extends from the first opening 7531 to the second opening 7571. A periphery of the platform 751 is connected to an inner surface 731 of the appurtenance 73, such that a containing space is formed between the platform 751 and the inner surface 731 of the appurtenance 73.

The second holding portion 77 comprises a pillar 771 and a cover 773. A first end of the pillar 771 is connected to the cover 773 for covering the pillar 771, and a second end of the pillar 771 is connected to the base 71. In general, a position of the pillar 771 corresponds to a position of the first breaking hole 753. When assembling the base 71 and the appurtenance 73, since the containing space (not shown) is formed between the platform 751 and the inner surface 731 of the appurtenance 73, the cover 773 of the second holding portion 77 can be contained in the containing space. The pillar 771 can pass through the second breaking hole 757, proceed along the passage 755 toward the first opening 7531, and then be inserted into the first breaking hole 753 through the first opening 7531, such that the base 71 is connected to the appurtenance 73. It should be noticed that a relationship among an outer diameter of the cover 773, an outer diameter of the pillar 771, a minimum width of the passage 755, a bore diameter of the first breaking hole 753 and a bore diameter of the second breaking hole 757 in FIG. 7A and FIG. 7B is identical to that mentioned in the aforesaid embodiment, so it will not be depicted herein. Furthermore, a guiding structure can be formed at a position close to the first opening 7531 and the second opening 7571.

Figure 8:
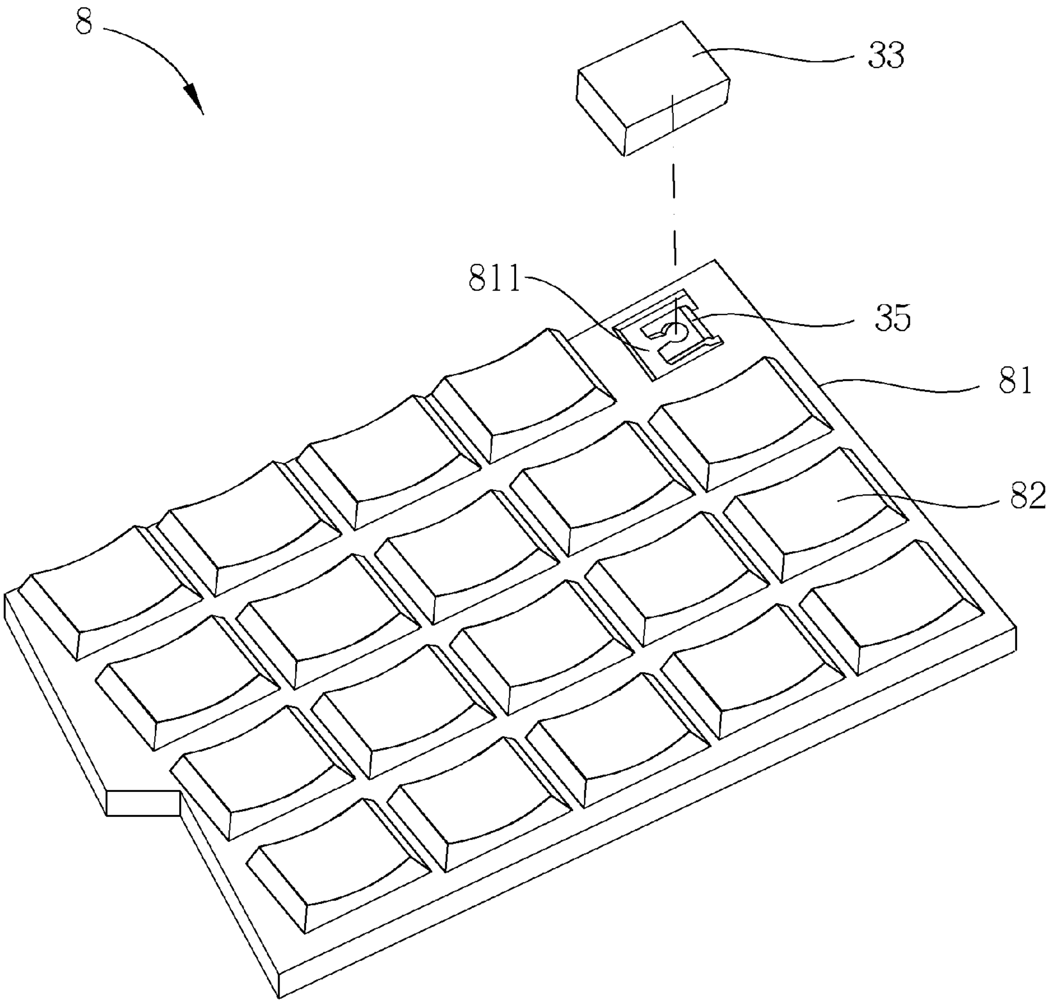
FIG. 8 is an exploded diagram illustrating a keyboard by implementing the connecting structure of keyboard appurtenance in FIG. 3A.

In practical application, the appurtenances 31, 41, 51, 61, 71 can be a dummy key or decorating strip on the keyboard. Another objective of the invention is to provide a keyboard equipped with the aforesaid connecting structure of keyboard appurtenance. Referring to FIG. 8 together with FIG. 3A and FIG. 3B, FIG. 8 is an exploded diagram illustrating a keyboard 8 equipped with the connecting structure of keyboard appurtenance in FIG. 3A. The keyboard 8 comprises a base 81, a plurality of keyswitches 82 disposed on the base 81 (only one keyswitch marked in FIG. 8), the appurtenance 33, the first holding portion 35 and the second holding portion 37. Structures of the appurtenance 33, the first holding portion 35 and the second holding portion 37 are identical to those in FIG. 3A.

The base 81 has a plurality of fixing structures (not shown), which can be connected to the plurality of keyswitches 82 disposed on the base 81. Furthermore, the base 81 has a hollow portion 811 whose structure is identical to the hollow portion 311 in FIG. 3A. In this embodiment, the first holding portion 35 is connected to the hollow portion 811, and the second holding portion 37 is connected to the appurtenance 33. The base 81 is connected to the appurtenance 33 by assembling the first holding portion 35 and the second holding portion 37. The method for assembling the base 81 and the appurtenance 33, and structures, functions and relative designs (such as a relationship among an outer diameter of the cover, an outer diameter of the pillar, a width of the passage and a bore diameter of the first breaking hole) of the appurtenance 33, the first holding portion 35 and second holding portion 37 are identical to those in FIG. 3A, so it will not be depicted herein.

In practical application, the structures of the base 81, the appurtenance 33, the first holding portion 35 and the second holding portion 37 of the keyboard 8 are not limited to those in FIG. 3A. They are also identical to those structures in FIG. 4A, FIG. 5A and FIG. 6A. When the structures of the first holding portion and the second holding portion are identical to those in FIG. 4A, FIG. 5A and FIG. 6A, the first holding portion can be connected to one of the base or the appurtenance, and the second holding portion can be connected to the other one of the base or the appurtenance correspondingly. Furthermore, a hollow portion or a recess can be formed on the base or on the appurtenance depending on practical application.

In summary, the first holding portion and the second holding portion of the connecting structure of keyboard appurtenance and keyboard of the invention can be disposed on the appurtenance or the base correspondingly. When the appurtenance is going to be connected to the base, the pillar of the second holding portion passes through the passage of the first holding portion so as to be contained in the first breaking hole. Compared to the appurtenance and the base being connected by hot melt adhesive, the connecting structure of the invention can avoid redundant manufacturing processes. Compared to the appurtenance and the base being connected by hook, the connecting structure of the invention can fix the appurtenance and the base more stably and tightly.

Those skilled in the art will readily observe that numerous modifications and alterations of the device and method may be made while retaining the teachings of the invention.

What is claimed is:

1. A connecting structure of keyboard appurtenance comprising:

a base;

an appurtenance;

a first holding portion comprising a platform, a first breaking hole being formed in the platform, the first breaking hole having a first opening, a passage extending from the first opening; and a second holding portion comprising a pillar and a cover, a first end of the pillar being connected to the cover, an outer diameter of the pillar being greater than a bore diameter of the first breaking hole and greater than an outer diameter of the pillar;

wherein the second holding portion is disposed on one of the base and the appurtenance, the first holding portion is disposed on the other one of the base and the appurtenance correspondingly, and the pillar of the second holding portion passes through the passage of the first holding portion so as to be contained in the first breaking hole, such that the appurtenance is connected to the base.

2. The connecting structure of keyboard appurtenance of claim 1, wherein the first holding portion is connected to the base, and a second end of the pillar of the second holding portion is connected to the appurtenance.

3. The connecting structure of keyboard appurtenance of claim 2, wherein the base has a hollow portion, the passage of the first holding portion extends from the first opening to a first side of the platform, a second side of the platform is connected to an edge of the hollow portion and the platform is located above the hollow portion, and the pillar is inserted into the passage from a gap between the platform and the hollow portion so as to be contained in the first breaking hole.

4. The connecting structure of keyboard appurtenance of claim 2, wherein a second breaking hole is formed on the platform of the first holding portion, the second breaking hole has a second opening, the passage extends from the first opening to the second opening, and the pillar is inserted into the passage from the second breaking hole so as to be contained in the first breaking hole.

5. The connecting structure of keyboard appurtenance of claim 4, wherein the base has a hollow portion, and the platform of the first holding portion is connected to an edge of the hollow portion and is located above the hollow portion.

6. The connecting structure of keyboard appurtenance of claim 4, wherein the base has a surface, a periphery of the platform is connected to the surface, a containing space is formed between the platform and the surface, and the pillar of the second holding portion is contained in the containing space.

7. The connecting structure of keyboard appurtenance of claim 4, wherein the outer diameter of the pillar is smaller than a bore diameter of the second breaking hole.

8. The connecting structure of keyboard appurtenance of claim 1, wherein the first holding portion is connected to the appurtenance, and a second end of the pillar of the second holding portion is connected to the base.

9. The connecting structure of keyboard appurtenance of claim 8, wherein the passage extends from the first opening to a first side of the platform, a second side of the platform is connected to a side of the appurtenance such that the first holding portion is connected to the appurtenance, and the pillar is contained in the first breaking hole by the passage.

10. The connecting structure of keyboard appurtenance of claim 8, wherein a second breaking hole is formed on the platform of the first holding portion, the second breaking hole has a second opening, the passage extends from the first opening to the second opening, and the pillar is inserted into the passage from the second breaking hole so as to be contained in the first breaking hole.

11. The connecting structure of keyboard appurtenance of claim 10, wherein the appurtenance has an inner surface, a periphery of the platform is connected to the inner surface, a containing space is formed between the platform and the inner surface of the appurtenance, and the cover of the second holding portion is contained in the containing space.

12. The connecting structure of keyboard appurtenance of claim 10, wherein an outer diameter of the cover is smaller than the bore diameter of the second breaking hole.

13. The connecting structure of keyboard appurtenance of claim 1, wherein the outer diameter of the pillar is greater than a minimum width of the passage.

14. The connecting structure of keyboard appurtenance of claim 1, wherein the outer diameter of the pillar is smaller than the bore diameter of the first breaking hole.

15. The connecting structure of keyboard appurtenance of claim 1, wherein the passage has a guiding structure away from the first opening, and a maximum width of the guiding structure is greater than the outer diameter of the pillar.

16. The connecting structure of keyboard appurtenance of claim 1, wherein the appurtenance is a dummy key or a decorating strip.

17. A keyboard comprising:

a base;

a plurality of keyswitches disposed on the base;

an appurtenance;

a first holding portion comprising a platform, a first breaking hole being formed in the platform, the first breaking hole having a first opening, a passage extending from the first opening; and a second holding portion comprising a pillar and a cover, a first end of the pillar being connected to the cover, an outer diameter of the pillar being greater than a bore diameter of the first breaking hole and greater than an outer diameter of the pillar;

wherein the second holding portion is disposed on one of the base and the appurtenance, the first holding portion is disposed on the other one of the base and the appurtenance correspondingly, and the pillar of the second holding portion passes through the passage of the first holding portion so as to be contained in the first breaking hole, such that the appurtenance is connected to the base.

18. The keyboard of claim 17, wherein the appurtenance is a dummy key or a decorating strip.

19. The keyboard of claim 17, wherein the first holding portion is connected to the base, and a second end of the pillar of the second holding portion is connected to the appurtenance.

20. The keyboard of claim 19, wherein the base has a hollow portion, the passage of the first holding portion extends from the first opening to a first side of the platform, a second side of the platform is connected to an edge of the hollow portion and the platform is located above the hollow portion, and the pillar is inserted into the passage from a gap between the platform and the hollow portion so as to be contained in the first breaking hole.

21. The keyboard of claim 19, wherein a second breaking hole is formed on the platform of the first holding portion, the second breaking hole has a second opening, the passage extends from the first opening to the second opening, and the pillar is inserted into the passage from the second breaking hole so as to be contained in the first breaking hole.

22. The keyboard of claim 21, wherein the base has a hollow portion, and the platform of the first holding portion is connected to an edge of the hollow portion and is located above the hollow portion.

23. The keyboard of claim 21, wherein the base has a surface, a periphery of the platform is connected to the surface, a containing space is formed between the platform and the surface, and the pillar of the second holding portion is contained in the containing space.

24. The keyboard of claim 21, wherein the outer diameter of the pillar is smaller than a bore diameter of the second breaking hole.

25. The keyboard of claim 17, wherein the first holding portion is connected to the appurtenance, and a second end of the pillar of the second holding portion is connected to the base.

26. The keyboard of claim 25, wherein the passage extends from the first opening to a first side of the platform, a second side of the platform is connected to aside of the appurtenance such that the first holding portion is connected to the appurtenance, and the pillar is contained in the first breaking hole by the passage.

27. The keyboard of claim 25, wherein a second breaking hole is formed on the platform of the first holding portion, the second breaking hole has a second opening, the passage extends from the first opening to the second opening, and the pillar is inserted into the passage from the second breaking hole so as to be contained in the first breaking hole.

28. The keyboard of claim 27, wherein the appurtenance has an inner surface, a periphery of the platform is connected to the inner surface, a containing space is formed between the platform and the inner surface of the appurtenance, and the cover of the second holding portion is contained in the containing space.

29. The keyboard of claim 27, wherein an outer diameter of the cover is smaller than the bore diameter of the second breaking hole.

30. The keyboard of claim 17, wherein the outer diameter of the pillar is greater than a minimum width of the passage.

31. The keyboard of claim 17, wherein the outer diameter of the pillar is smaller than the bore diameter of the first breaking hole.

32. The keyboard of claim 17, wherein the passage has a guiding structure away from the first opening, and a maximum width of the guiding structure is greater than the outer diameter of the pillar.

* * * * *